(12) United States Patent
Himmelsbach et al.

(10) Patent No.: US 9,308,601 B2
(45) Date of Patent: Apr. 12, 2016

(54) LASER PROCESSING SYSTEM HAVING A LASER SHIELD AND A TRANSMISSION WINDOW

(71) Applicant: Carl Zeiss Microscopy GmbH, Jena (DE)

(72) Inventors: Volker Himmelsbach, Heidenheim (DE); Sebastian Alscher, Aalen (DE); Holger Doemer, Bopfingen (DE); Bernd Stenke, Illertissen (DE); Ulrich Spittler-Herrmann, Oberkochen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 371 days.

(21) Appl. No.: 13/922,158

(22) Filed: Jun. 19, 2013

(65) Prior Publication Data

US 2013/0341313 A1 Dec. 26, 2013

(30) Foreign Application Priority Data

Jun. 21, 2012 (DE) .......................... 10 2012 012 275

(51) Int. Cl.
*B23K 26/08* (2014.01)
*B23K 26/12* (2014.01)
(Continued)

(52) U.S. Cl.
CPC .............. *B23K 26/127* (2013.01); *B23K 26/03* (2013.01); *B23K 26/08* (2013.01); *B23K 26/082* (2015.10); *B23K 26/0807* (2013.01); *B23K 26/12* (2013.01); *B23K 26/122* (2013.01); *B23K 26/123* (2013.01); *B23K 26/128* (2013.01); *B23K 26/1224* (2015.10);
(Continued)

(58) Field of Classification Search
CPC ........ B23K 26/42; B23K 26/36; B23K 26/08; B23K 26/12; B23K 26/03; H01J 37/30
USPC ........... 219/121.86, 121.68; 250/492.1–492.3
See application file for complete search history.

(56) References Cited

U.S. PATENT DOCUMENTS

| 4,979,181 A | 12/1990 | Nakanose et al. |
| 2005/0118065 A1* | 6/2005 | Hasegawa ............... H01J 37/28 422/502 |
| 2012/0181454 A1* | 7/2012 | Kubota .............. B23K 26/0084 250/492.1 |

FOREIGN PATENT DOCUMENTS

| DE | 4013192 A1 | 10/1990 |
| DE | 19918802 A1 | 11/2000 |

(Continued)

*Primary Examiner* — Samuel M Heinrich
(74) *Attorney, Agent, or Firm* — Alston & Bird LLP

(57) ABSTRACT

A processing system for micro processing. The processing system comprises a laser configured to generate a laser beam for performing laser processing within a preparation chamber. The processing system further comprises a transmission window, configured such that the laser beam enters into the preparation chamber through the transmission window. The processing system further comprises a fastening flange for fixing the transmission window relative to the preparation chamber, and a laser shield configured to provide, in a first arrangement of the laser shield, glare protection from a passage of the laser beam from a laser beam housing to the preparation chamber. The laser shield is movably mounted for movement between the first arrangement and a second arrangement of the laser shield, wherein in the second arrangement, at least one of the transmission window and the fastening flange is separable from the processing system.

27 Claims, 7 Drawing Sheets

(51) Int. Cl.
  *B23K 26/03* (2006.01)
  *B23K 26/30* (2014.01)
  *B23K 26/36* (2014.01)
  *B23K 37/00* (2006.01)
  *H01J 37/305* (2006.01)

(52) U.S. Cl.
  CPC ............... *B23K 26/36* (2013.01); *B23K 26/42* (2013.01); *B23K 26/422* (2013.01); *B23K 26/427* (2013.01); *B23K 26/70* (2015.10); *B23K 26/702* (2015.10); *B23K 26/706* (2015.10); *B23K 37/006* (2013.01); *H01J 37/3056* (2013.01)

(56) References Cited

FOREIGN PATENT DOCUMENTS

| | | |
|---|---|---|
| EP | 2359977 A1 | 8/2011 |
| JP | 2011240365 A | 12/2011 |

\* cited by examiner

A LASER PROCESSING SYSTEM HAVING A LASER SHIELD AND A TRANSMISSION WINDOW

CROSS-REFERENCES TO RELATED APPLICATIONS

This application claims priority of Patent Application No. 10 2012 012 275.6, filed Jun. 21, 2012 in Germany, the entire contents of which are incorporated by reference herein.

FIELD

The present invention relates to a processing system for micro processing of an object. The micro processing is performed by laser processing, such as laser ablation.

BACKGROUND

There are systems known, which have been developed for micro processing an object by laser ablation and subsequent focused ion beam (FIB) preparation.

Laser ablation processes allow to achieve high ablation rates, compared to processing procedures, which rely on ion beams. These high ablation rates allow effective application of these processes in biosciences, quality assurance and process control procedures. Quality assurance and process control procedures are largely applied in semiconductor manufacturing processes.

High ablation rates also make it possible to expose large cross-sectional areas of the object, which are buried deeply below the surface of the object. Thereby, time-efficient inspections of complex semiconductor structures, such as multiple stacked ICs and 3D MEMS, can be performed.

Typically, the laser system is arranged outside of the preparation chamber and the laser beam is introduced into the interior of the preparation chamber through a transmission window mounted to the preparation chamber.

Performing the laser ablation processes in the interior of the preparation chamber typically causes contamination on the vacuum-side surface of the transmission window. However, also the atmosphere side surface may suffer contamination from ambient air.

Such a contamination may lead to a lower light intensity of the laser beam reaching the object, or may even lead to destruction of the transmission window caused by the heat introduced by the laser beam impinging on the low-transmissive window. High contamination levels typically occur during routine use of the processing system for process control. In order to ensure operability of the processing system, the transmission window has to be removed from the processing system and cleaned on a regular basis.

Moreover, also the typical levels of thermal stress, which is introduced into the transmission window by the laser beam, require to check the condition of the transmission window.

Hence, it is desirable, to provide a processing system for laser micro processing, which allows easy maintenance or replacement of a laser transmission window.

SUMMARY

Embodiments provide a processing system for micro processing by laser processing. The processing system comprises a preparation chamber and a laser configured to generate a laser beam for performing the laser processing within the preparation chamber. The processing system further comprises a transmission window, configured such that the laser beam enters into the preparation chamber through the transmission window. The processing system further comprises a fastening flange for fixing the transmission window relative to the preparation chamber. The processing system further comprises a laser beam housing, configured such that a portion of the laser beam, which is located outside of the preparation chamber, extends within the laser beam housing. The processing system further comprises a laser shield configured to provide, in a first arrangement of the laser shield, glare protection from a passage of the laser beam from the laser beam housing to the preparation chamber. The laser shield is movably mounted for movement between the first arrangement and a second arrangement of the laser shield, wherein in the second arrangement, at least one of the transmission window and the fastening flange is separable from the processing system.

Thereby, a processing system is provided, which allows to separate the transmission window from the processing system without much effort. This allows to replace, to inspect or to clean the transmission window in an easy and time efficient manner. Hence, downtime and maintenance costs are reduced.

The laser may be configured to generate a pulsed laser beam. A pulse duration of the laser beam may be within a range of between $10^{-16}$ seconds to 1 second or within a range of between $10^{-16}$ seconds to $10^{-8}$ seconds. Alternatively or additionally, the laser may be configured to generate a continuous laser beam. The laser may be arranged outside of the preparation chamber.

The laser processing may comprise one or a combination of the following processes: laser ablation, laser desorption, photo chemical laser etching (PLE), laser-assisted chemical etching (LCE), gas-assisted etching (GAE). The laser processing may be at least partially performed in vacuum. During the laser processing, an inert gas, a precursor gas and/or an etching gas may be supplied to the object by a gas supply system.

A preparation pressure for performing the laser ablation process may be within a range of between $10^{-8}$ mbar to 2000 mbar, or within a range of between $10^{-8}$ mbar to 1000 mbar, or within a range of between $10^{-8}$ mbar to $10^{-4}$ mbar.

The preparation pressure may be at least temporarily in a vacuum pressure range. The vacuum pressure range may be defined herein as pressure values which are lower than 300 mbar.

The fastening flange and the transmission window may be configured such that the transmission window is arranged at the preparation chamber in a gas-tight and/or vacuum-tight manner.

A leak rate of the transition between the transmission window and the chamber wall may be less than $10^{-5}$ mbar·l/s, or less than $10^{-6}$ mbar·l/s, or less than $10^{-8}$ mbar·l/s. The transition may comprise one or more seal elements. In other words, the fastening mechanism, which fastens the transmission window to the camber wall produces these leak rates.

The preparation chamber, which is provided for performing the laser ablation, may comprise a gas supply system, a gas pump system and/or a vacuum pump system for sustaining the preparation pressure. The preparation chamber may be configured as a vacuum chamber, as a low-pressure chamber and/or as a hyperbaric chamber. The preparation chamber may be at least partially made of metal.

The processing system may comprise a focused ion beam system for processing an object, which has been pre-prepared by the laser processing. The focused ion beam system may be configured to generate a focused ion beam for ion beam etching. The ions of the focused ion beam may be for example gallium ions, helium ions, argon ions or xenon ions. The focused ion beam system may comprise a liquid metal ion source (LMIS). The liquid metal ion source may for example be a gallium ion source. Additionally or alternatively, the focused ion beam system may comprise a plasma ion source. The plasma ion source may for example be a xenon ion source. Additionally or alternatively, the focused ion beam system may comprise a field ion source. The field ion source may for example be a helium, argon or xenon field ion source.

The processing system may further comprise a scanning electron microscope system and/or an ion microscope system. The ion microscope system may comprise a gas field ion source. The ion microscope system may be a helium ion microscope system. The scanning electron microscope system and/or the ion microscope system may be configured such that the processing of the surface, which is performed by the focused ion beam system can be monitored by scanning a focused electron beam and/or a focused ion beam. The object region of the scanning electron microscope system and/or the object region of the ion microscope system may at least partially overlap with an object region of the focused ion beam system. Alternatively or additionally, the processing system may comprise a light optical microscope and/or a camera, which are configured such that the focused ion beam processing can be monitored with the light optical microscope and/or with the camera.

The ion beam etching may be a dry etching process. The processing system may comprise a gas supply system, which is configured such that during the focused ion beam processing, a process gas can be supplied to the processing region of the object. The process gas may be activatable by the ion beam of the focused ion beam system, by the electron beam of the scanning electron microscopy system, and/or by the ion beam of the ion microscope system. The activated process gas may cause material ablation in the processing region. The ion beam of the focused ion beam system may be focused onto the object. A focus diameter of the ion beam may be within a range of between 0.1 nanometers and 30 nanometers, or within a range of between 5 nanometers and 30 nanometers.

The laser beam is introduced into the preparation chamber through the transmission window. The transmission window may be at least partially transparent for light of the laser beam. A transmission of the transmission window for each wavelength of a wavelength range of light, which is emitted by the laser may be greater than 60% or greater than 80%.

The laser light may enter the transmission window from the outside of the preparation chamber at a first wide side surface or flat face of the transmission window. The laser light may enter into the interior of the preparation chamber from the transmission window at a second wide side surface or flat face of the transmission window.

The first wide side surface may be disposed toward the outside of the preparation chamber and at least a portion of the second wide side surface may be disposed toward the interior of the preparation chamber. The second wide side surface may also comprise a region, which is disposed toward the outside of the preparation chamber.

The first and the second wide side surfaces may be opposed and/or parallel surfaces. A thickness of the transmission window, measured in a direction perpendicular to the first and/or second wide side surface may be within a range of between 1 millimeters and 300 millimeters, or within a range of between 1 millimeters and 100 millimeters. A diameter of the transmission window, measured parallel to the first and/or second wide side surfaces may be within a range of between 1 millimeters and 300 millimeters, or within a range of between 10 millimeters and 300 millimeters. The transmission window may be made at least partially from quartz glass and/or borosilicate glass.

The fastening flange may be configured such that the transmission window is replaceably fixed relative to the preparation chamber. The transmission window may be secured to the fastening flange by clamping.

At least a portion of the laser beam housing may be in the form of a tube. A diametrical extent of a cross-section of an interior of the laser beam housing may be within a range of between 1 millimeter and 300 millimeters, or within a range of between 10 millimeters and 300 millimeters. The cross-section may be oriented parallel to a wide side surface of the transmission window. A length of the laser beam housing, measured in a direction, which is oriented parallel to a surface normal of a wide side surface of the transmission window may be within a range of between 1 millimeter and 1000 millimeters, or within a range of between 5 millimeters and 1000 millimeters. At least portion of the interior of the laser beam housing may have a circular or substantially circular cross-section.

The laser beam housing may completely enclose at least a section of the laser beam path. The section may be located outside of the preparation chamber. The laser beam housing may be abuttingly attached to the preparation chamber or to a chamber wall of the preparation chamber.

The laser beam housing may be configured such that the fastening flange is arranged at least partially in the interior of the laser beam housing. The laser beam housing may have a cutout for at least partially receiving the fastening flange. The fastening flange may be arranged at an exit side of the laser beam housing. At an entrance side of the laser beam housing and/or in an interior of the laser beam housing, an objective lens of the processing system may be arranged for focusing the laser beam onto an object region located within the preparation chamber.

The laser shield may be at least partially made from sheet metal and/or plastics. A thickness of the sheet metal and/or plastics may be within a range of between 0.2 millimeters to 20 millimeters. The laser shield may be made by a metal forming process. The laser shield may be movably mounted on the laser beam housing and/or on the chamber wall of the preparation chamber. During the movement of the laser shield, the laser shield may be fittingly guided by the laser beam housing. In the first and second arrangements, the laser shield may abut to the laser beam housing. The laser shield may be guided or form-fittingly guided by the laser beam housing for movement between the first and the second arrangement. By way of example, the laser shield may at least partially engage around the laser beam housing. An interior surface of the laser shield may be form fittingly guided by an outer surface of the laser beam housing. The interior surface may face the laser beam. The outer surface may face away from the laser beam. Alternatively or additionally, the laser shield, the laser beam housing and/or the chamber wall may comprise guiding elements for guiding the movement of the laser shield.

As used herein, the first and/or the second arrangement of the laser shield may refer to a position and/or an orientation of the laser shield. In other words, the movement from the first arrangement to the second arrangement may include changing the position and/or the orientation of the laser shield. The first and/or the second arrangement may be measured relative to a stationary coordinate system. During the movement of the laser shield from the first arrangement to the second arrangement, the laser beam housing, the preparation chamber, the fastening flange and/or the transmission window may remain stationary.

The laser shield may be configured to provide glare protection from the passage of the laser beam from the laser beam housing to the preparation chamber. The laser shield may be configured to shield light of the laser beam. The laser shield may comprise a cutout for at least partially receiving the fastening flange. In the first arrangement, the laser shield may abut to the preparation chamber or to a chamber wall of the preparation chamber. A minimal distance between the laser shield and an entrance opening of the chamber wall in the second arrangement, may be greater than in the first arrangement by a value of between 0.1 millimeters and 500 millimeters, or between 5 millimeters and 500 millimeters, or between 20 millimeters and 500 millimeters. The laser beam may enter the preparation chamber through the entrance opening. The fastening flange may comprise fastening elements for fastening the fastening flange to the preparation chamber. By way of example, the fastening elements may be screws. The fastening elements may require a working space for releasing the fastening elements. The laser shield may be configured to free the working space of at least one of the fastening elements when being moved from the first arrangement to the second arrangement. Thereby, in the second arrangement, each of the fastening elements may be releasable. In the first arrangement of the laser shield, the working space of at least one of the fastening elements may be at least partially blocked by the laser shield.

In the second arrangement of the laser shield, the transmission window and/or the fastening flange may be separable from the remaining processing system. In other words, the processing system is configured such that in the second arrangement, movements of the fastening flange and/or the transmission window, which are required for the separation, are not blocked. During the separation, the laser shield, the laser beam housing, the preparation chamber and/or the remaining processing system may remain stationary. In the first arrangement, the laser shield may block a movement of the fastening flange and/or transmission window for performing the separation. The fastening flange may be configured such that the fastening flange and the transmission window are simultaneously separable as a unit from the processing system. During the separation, the transmission window may remain fastened to the fastening flange.

According to an embodiment, the processing system comprises a motion lock for at least temporally locking a deviation of the laser shield from the first arrangement. The motion lock may be a mechanical and/or an electrical motion lock.

The processing system may further comprise a controller for detecting whether or not the motion lock is activated and/or whether or not the laser shield is arranged in the first arrangement. When the motion lock is activated, a deviation of the laser shield from the first arrangement may be blocked. The controller may control an activation of the laser beam, wherein the activation of the laser beam requires the laser shield to be arranged in the first arrangement and/or requires the motion lock to be activated. The processing system may further be configured such that a detection of the laser shield being arranged in the first arrangement requires the motion lock to be activated.

According to an embodiment, the processing system comprises an electrical connector, arranged stationary relative to at least one of the laser beam housing and the preparation chamber. The processing system may further comprise an electrical mating connector. The laser shield may be configured such that a connection of the mating connector to the connector requires the first arrangement of the laser shield.

The laser shield may be configured such that the connection of the mating connector to the connector blocks a deviation of the laser shield from the first arrangement.

According to a further embodiment, the processing system comprises a controller, which is in signal communication with the mating connector, wherein the controller, the connector and the mating connector are configured such that the controller can detect, whether or not the connector and the mating connector are connected to each other. The connector may comprise a contact bridge bridging two contacts of the connector. The controller may be configured to measure a conductivity between two contacts of the mating connector, which correspond to the bridged contacts of the connector. The controller may further be configured to control, depending on the detected connection or disconnection, whether or not to activate the laser beam.

According to a further embodiment, the laser shield comprises a through-recess. In the first arrangement of the laser shield, the mating connector may be connectable to the connector by inserting the mating connector through the through-recess. The laser shield may be configured such that a deviation from the first arrangement of the laser shield blocks the mating connector from being connected to the connector.

The through-recess may be an opening and/or a circular hole recess. The laser shield may block the connection by at least partially covering the connector or an insertion opening of the connector. In the first arrangement of the laser shield, the through-recess may leave an insertion opening of the connector accessible. When the connector is connected to the mating connector, the mating connector is inserted through the through-recess.

According to a further embodiment, the processing system comprises light optical component, which is attached to the laser beam housing. At least a portion of the light optical component may be arranged in the laser beam.

The light optical component may comprise an optical element. The optical element may for example comprise one or a combination of a light optical filter, a scanning mirror, a beam splitter, a deflecting element, a refractive optical element, such as lens or a cemented lens, a shutter, an objective lens, and an aperture stop. The light optical component may comprise a scanning system or a portion of a scanning system for scanning the laser beam across the object region in one or two dimensions. At least a portion of the light optical component may be disposed in the laser beam.

The light optical component may further comprise a holding system for attaching the light optical component to the laser beam housing. The optical elements may be fastened to the holding system.

According to a further embodiment, the laser shield is movably mounted such that the laser shield is movable from the first arrangement to an arrangement, in which the light optical component is separable from the processing system.

The arrangement of the laser shield, in which the light optical component is separable from the processing system may be the second arrangement. The laser beam housing may comprise a cutout for at least partially receiving the light optical component. In the first arrangement of the laser shield, the laser shield may block a movement of the light optical component for separating the light optical component from the processing system.

According to a further embodiment, the fastening flange comprises a first fastening system for fastening the fastening flange to the preparation chamber. The laser beam housing may be abuttingly attached to the preparation chamber. The laser beam housing may comprise a cutout for at least partially receiving the fastening flange. The laser beam housing may leave a working space of the first fastening system. The laser shield may comprise a coutout for at least partially receiving the first fastening system in the first arrangement of the laser shield.

Thereby, a processing system is obtained having a fastening flange, which is separable from the processing system without having to separate the laser beam housing from the processing system. This allows for fast separation of the transmission window. Even more, light optical components, which are disposed in the interior of the laser beam housing, can not get out of adjustment by the separation process.

The first fastening system may comprise one or more fastening elements, or may consist of one or more fastening elements. The fastening element may be, for example, a screw.

The laser beam housing leaves the working space of the first fastening system free. In other words, the laser beam housing does not block the space, which is required for releasing the first fastening system. The first fastening system may be arranged outside of the laser beam housing. The laser shield may be configured such that in the first arrangement, in which glare protection is provided, the working space of the first fastening system is at least partially blocked. The working space of the first fastening system may be defined as a space, which is required for releasing the first fastening system such that the fastening flange is separable from the processing system. For example, the working space may comprise the space above the screw head of a screw, which is required for loosening the screw. The processing system may be configured such that the fastening flange is separable from the processing system with the laser beam housing remaining fastened to the processing chamber.

According to a further embodiment, the processing system comprises a sealing element, which is arranged between a sealing surface of the transmission window and a sealing surface of the preparation chamber.

The sealing element may be vacuum sealing element. The sealing element may be a plastic sealing element, in particular an elastomer sealing element. The sealing element may be at least partially made of Viton or Teflon (both trademarks of DuPont). The sealing element may be an O-ring sealing element. The sealing surface of the chamber wall and the sealing surface of the transmission window may be arranged to compress the sealing element in a direction, which is oriented parallel to a surface normal of a wide side surface of the transmission window.

The sealing surface of the transmission window may be arranged at a wide side surface of the transmission window. The sealing surfaces of the transmission window and the chamber wall may be the only surfaces, which are in contact with the sealing element in the sealed state.

According to a further embodiment, the transmission window comprises a first abutting surface on a first wide side surface of the transmission window and a second abutting surface on a second wide side surface of the transmission window. The transmission window may be fastened to the fastening flange at the first and second abutting surfaces.

In other words, the first and the second abutting surfaces for fastening the transmission window to the fastening flange are in contact with the fastening flange. Thereby, a processing system is provided, which allows to fasten the transmission window to the fastening flange such that the fastening flange and the transmission window can be separated from the processing system as a unit.

The first and the second abutting surfaces may be opposing surface portions of the transmission window. The transmission window may be fastened to the fastening flange by clamping the transmission window at the first and at the second abutting surfaces. Each of the first and the second abutting surfaces may be in the form of a closed loop surrounding the transmission region of the transmission window. The transmission region may be defined as the summation of all regions of the transmission window, through which the laser beam at least temporarily traverses the transmission window. The transmission window may comprise one or more abutting surfaces on the first and/or the second wide side surface. The abutting surfaces of a common wide side surface may form sectors, wherein each of the sectors partially surrounds the transmission region. The sealing surface of the transmission window may be arranged between the transmission region and the abutting surface of a wide side surface, wherein the wide side surface is at least partially disposed toward the interior of the preparation chamber.

According to a further embodiment, the fastening flange comprises clamping surfaces for a clamping of the transmission window at the first and the second abutting surfaces.

Each of the clamping surfaces may form a closed loop, which surrounds the transmission region. According to a further embodiment, the clamping surfaces of the fastening flange, which are arranged at a common wide side surface of the transmission window form sectors, wherein each of the sectors partially surrounds the transmission region of the transmission window.

According to a further embodiment, the processing system comprises an optical measuring system, which is at least partially received within the laser beam housing, wherein the optical measuring system is configured to measure parameters of the laser beam.

The light optical measuring system may be configured to measure the intensity of the laser beam and/or the deflection of the laser beam. By way of example, the light optical measuring system may be configured to determine whether or not the laser beam is activated. Alternatively or additionally, the light optical measuring system may be configured to determine a spectral and/or spatial intensity distribution of the laser beam.

According to a further embodiment, the processing system comprises a detector system, which is at least partially received within the laser beam housing. The detector system may be configured to detect light emitted from an interior of the preparation chamber.

The detector system may be configured to detect light, which is emitted from an interaction region of the laser beam with the object and/or with the object holder. The detector system may be part of a system for determining a position and/or an orientation of the object and/or the object holder in the preparation chamber.

According to a further embodiment, the detector system is configured for an optical endpoint detection of the laser processing.

The endpoint detection may be an endpoint detection during the laser processing. The endpoint detection may be an automatic endpoint detection. The detector system may detect an intensity of light, which has been emitted from an interaction region of the laser beam with the surface of the object. The detector system may be configured to detect the light in different wavelength ranges. The wavelength ranges may be characteristic for the chemical composition of the object. The detector system may be in signal communication with a controller, which controls a deflection and/or an intensity of the laser beam in the object region, depending on the detected light intensity.

According to a further embodiment, the fastening flange comprises an abutting surface, which abuts against the preparation chamber.

The abutting surface may continuously surround the transmission region. The fastening flange may comprise a plurality of abutting surfaces, which are distributed around the transmission region or which form sectors, wherein each of the sectors partially surrounds the transmission region.

According to a further embodiment, the fastening flange comprises a first fastening system for fastening the fastening flange to the preparation chamber. The fastening flange may further comprise a second fastening system for fastening the transmission window to the fastening flange. The fastening flange may be configured such that the first fastening system is releasable with the second fastening system remaining fastened.

Thereby, a processing system is provided, having a fastening flange, which is separable from the chamber wall without having to release the second fastening system. Thereby, the transmission window may remain fastened to the fastening flange during the separation process, during the cleaning or maintenance process, and during the remounting of the fastening flange on the processing system.

Each of the first and/or second fastening system may comprise one or more fastening elements. A fastening element may be a screw.

According to a further embodiment, the laser shield comprises a guiding surface, which faces the laser beam. The laser beam housing may comprise a guiding surface, which faces away from the laser beam. The guiding surface of the laser shield and the guiding surface of the laser beam housing may be configured as a form-fitting guide for movably guiding the laser shield.

The form-fitting guide may guide the laser shield to move from the first arrangement to the second arrangement. The guiding surface of the laser shield may be an inner surface or an inner circumferential surface of the laser shield. The guiding surface of the laser beam housing may be an outer surface or an outer circumferential surface of the laser beam housing. At least a portion of the guiding surface of the laser beam housing and/or the guiding surface of the laser shield may be formed substantially like a cylinder surface.

According to a further embodiment, the guiding surface of the laser shield and the guiding surface of the laser beam housing are configured as a form-fitting guide for movably guiding the laser shield.

Thereby, it is possible to provide a processing system, wherein between the fastening flange and the transmission window, there is no sealing element provided. Thereby, the transmission window can remain fastened to the fastening flange during the cleaning process, since there is no sealing element, which could be damaged by the cleaning process.

Furthermore, the seal-free contact between the fastening flange and the transmission window ensures that the relative orientation between the fastening flange and the transmission window remains constant. Thereby, it is prevented that a change of the orientation of the transmission window relative to the preparation chamber causes the impingement location of the laser beam on the object surface to be varied.

The fastening flange may be at least partially made of metal, such as for example alumina, stainless steel, titanium or combinations thereof.

BRIEF DESCRIPTION OF THE DRAWINGS

The forgoing as well as other advantageous features of the disclosure will be more apparent from the following detailed description of exemplary embodiments with reference to the accompanying drawings. It is noted that not all possible embodiments necessarily exhibit each and every, or any, of the advantages identified herein.

DETAILED DESCRIPTION OF EXEMPLARY EMBODIMENTS

Figure 1:
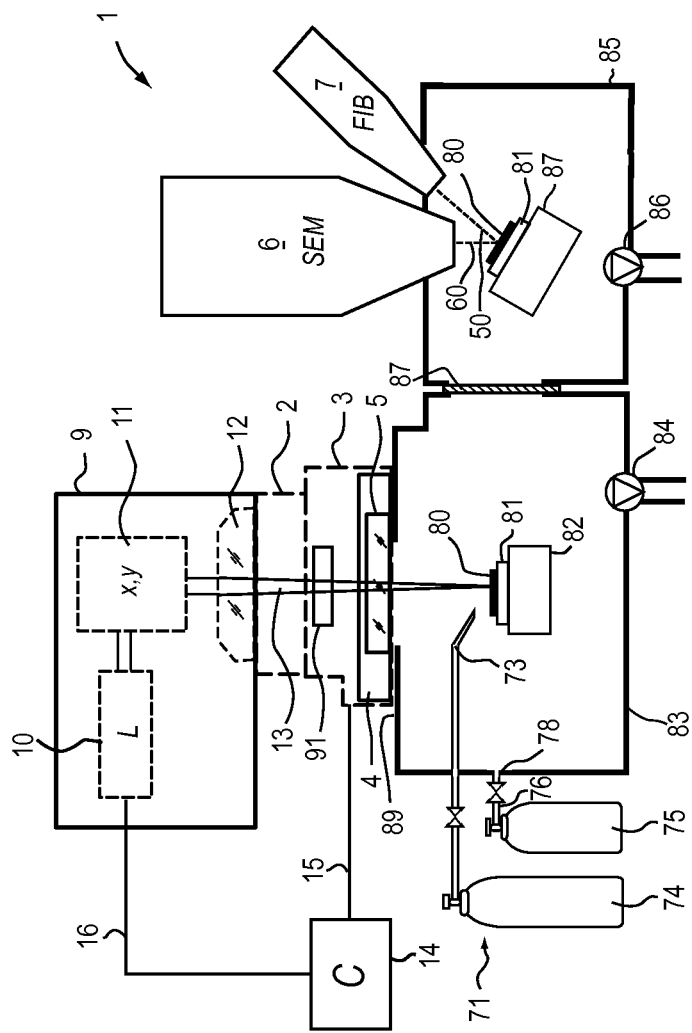
FIG. 1 schematically illustrates a processing system according to an exemplary embodiment.

In the exemplary embodiments described below, components that are alike in function and structure are designated as far as possible by alike reference numerals. Therefore, to understand the features of the individual components of a specific embodiment, the descriptions of other embodiments and of the summary of the disclosure should be referred to.

FIG. 1 shows a processing system 1 for laser micro processing according to an exemplary embodiment. The processing system 1 comprises a laser 10 for generating a laser beam 13. Laser 10 is configured to perform laser processing of an object 80 in a first preparation chamber 83. The first preparation chamber 83 is configured as a vacuum chamber. In other words, the preparation chamber is configured such that the laser processing can be performed at a preparation pressure, which is at least temporarily lower than 300 mbar. Additionally or alternatively, the preparation chamber may be configured such that the laser processing can be performed at a preparation pressure, which may assume values greater than 300 mbar and/or which may be greater than atmospheric pressure.

A pre-prepared surface region of the surface of the object 80 is formed by the laser processing. The laser processing may comprise laser ablation. After the laser processing has been completed, a focused ion beam processing is performed in the second preparation chamber 85 by using a focused ion beam 50 of a focused ion beam system 7.

The second preparation chamber 85 is also configured as a vacuum chamber. The first and the second preparation chambers 83, 85 are connected to each other through a conduit, which comprises a gate valve 87. Thereby, the object 80 and the object holder 81 are transferable from the first preparation chamber 83 into the second preparation chamber 85. Each of the first and the second preparation chambers 83, 85 are coupled to a respective vacuum pump system 84, 86. It is also conceivable that the processing system 1 is configured such that the laser processing with the laser beam 13 and the preparation with the focused ion beam 50 can be performed in a common preparation chamber.

The processing system 1 further comprises a scanning electron microscope system 6. The scanning electron microscope system 6 is configured such that the preparation, which is performed with the focused ion beam system 7, can be monitored by scanning a focused electron beam 60. To this effect, the scanning electron microscope system 6 is arranged such that an object region of the scanning electron microscope system 6 and an object region of the focused ion beam system 7 overlap each other.

Additionally or alternatively to the focused ion beam system 7 or to the scanning electron microscope system 6, the processing system 1 may comprise an ion microscope system for micro processing and/or for microscopic imaging of the object with a scanable focused ion beam.

The processing system 1 further comprises an objective lens 12. The objective lens 12 is configured to focus the laser beam onto an object region. The processing system 1 further comprises a deflecting system 11. The deflecting system 11 is configured to scan the laser beam 13 across the object region in two dimensions. Furthermore, the processing system 1 is configured such that the focus position of the laser beam 13 can be shifted along its beam axis. For example, the processing system may be configured such that the focus position is variable by adjusting a beam expansion of the laser beam 13.

In each of the first and the second preparation chambers 83, 84 a positioning system 82, 87 is arranged for positioning the object 80 relative to the focus of the laser beam 13 and relative to the focus of the ion beam 50. Alternatively or additionally, the processing system 1 may be configured such that all laser processing procedures can be performed at a same position and orientation of the object 80 within the preparation chamber 83. In this configuration, the laser processing can be performed in the first preparation chamber 83 without a positioning system 82 and the deflecting system 11 may be configured to vary a direction of incidence of the laser beam relative to the object 80.

The processing system 1 further comprises a gas supply system 71 for supplying gas into the first preparation chamber 83. Gas from a first gas reservoir 74 is supplied by a first gas supply line 73 onto the surface of the object 80. An exit opening of the first gas supply line 73 is arranged at a distance of less than 50 millimeters from the object surface. Thereby, it is possible to feed inert gas to the surface for preventing particle readsorption in the processing region.

Furthermore, the first gas supply line 73, allows to feed gas to the surface of the object 80 for performing processing procedures such as gas assisted etching (GAE), photochemical laser etching (PLE) and/or laser-assisted chemical etching (LCE).

Additionally or alternatively, the gas supply system 71 comprises a second gas supply line 76 for supplying gas from a second gas reservoir 75 into the first preparation chamber 83. The second gas supply conduit 76 opens into the interior of the first preparation chamber 83 at a portion 78 of the chamber wall. Thereby, it is possible to supply gas from the second reservoir 75 to the interior of the preparation chamber 83, such that a uniform partial pressure of the gas is obtained in the preparation chamber 83. The gas in the second gas reservoir 75 may for example be inert gas.

Alternatively or additionally, the processing system 1 may comprise a further gas supply system (not shown in FIG. 1) for supplying a gas into the second preparation chamber 85.

The laser 10, the deflecting system 11 and the objective lens 12 are arranged in a common laser housing 9. After leaving the laser 10, the laser beam 13 enters the deflecting system 11. After leaving the deflecting system 11, the laser beam 13 traverses the objective lens 12. After leaving the objective lens 12, the laser beam 13 traverses an optical filter 91. After leaving the optical filter 91, the laser beam 13 traverses a transmission window 5, whereby the laser beam 13 enters the first preparation chamber 83. The transmission window 5 is fixed relative to a chamber wall 89 of the first preparation chamber 83 by a fastening flange 4.

After leaving the objective lens 12, the laser beam is guided through a laser beam housing 2 for protecting users of the processing system 1 from a glare and/or other dangers caused by the light of the laser beam 13. The laser beam housing 2 is configured such that a filter holder (not shown in FIG. 1) for holding a filter 81 is attachable to the laser beam housing 2. The laser beam housing 2 is abuttingly attached to both the laser housing 9 and the chamber wall 89. The laser housing 9 may abut to the laser beam housing 2 in a light-tight manner. The processing system 1 further comprises a laser shield 3 for providing glare protection from the passage of the laser beam 13 between the laser beam housing 2 and the preparation chamber 83. The laser shield 3 is arranged at the laser beam housing 2. The design of the laser beam housing 2 and the laser shield 3 is described in detail with reference to FIGS. 2A, 2B and 2C.

The laser shield 3 is movably mounted on the laser beam housing 2. The glare protection is provided when the laser shield 2 is arranged in a first arrangement. The movable mounting allows to move the laser shield 3 from the first arrangement to a second arrangement. In the second arrangement, the fastening flange 4 and the transmission window 5 can be separated from the processing system 1. The movement of the laser shield 3 and the separation of the fastening flange 4 and the transmission window 5 is performed at a stationary position and orientation of the laser beam housing 2.

Thereby, a processing system is provided, which allows to separate the transmission window 5 from the processing system 1 without much effort. Thereby, it is possible to clean or replace the transmission window 5. During the cleaning process, the transmission window 5 can remain fastened to the fastening flange 4.

The processing system 1 further comprises a controller 14, which is configured to detect via a first signal line 15, whether or not the laser shield 3 is arranged in the first arrangement and whether or not the motion lock is in an activated state. In the activated state, the motion lock blocks a deviation of the laser shield 3 from the first arrangement. The controller is further in signal communication with the laser 10 via a second signal line 16 for activating the laser beam 13 after the arrangement of the laser shield 3 in the first arrangement and the activation of the motion lock has been detected.

Figure 2A:
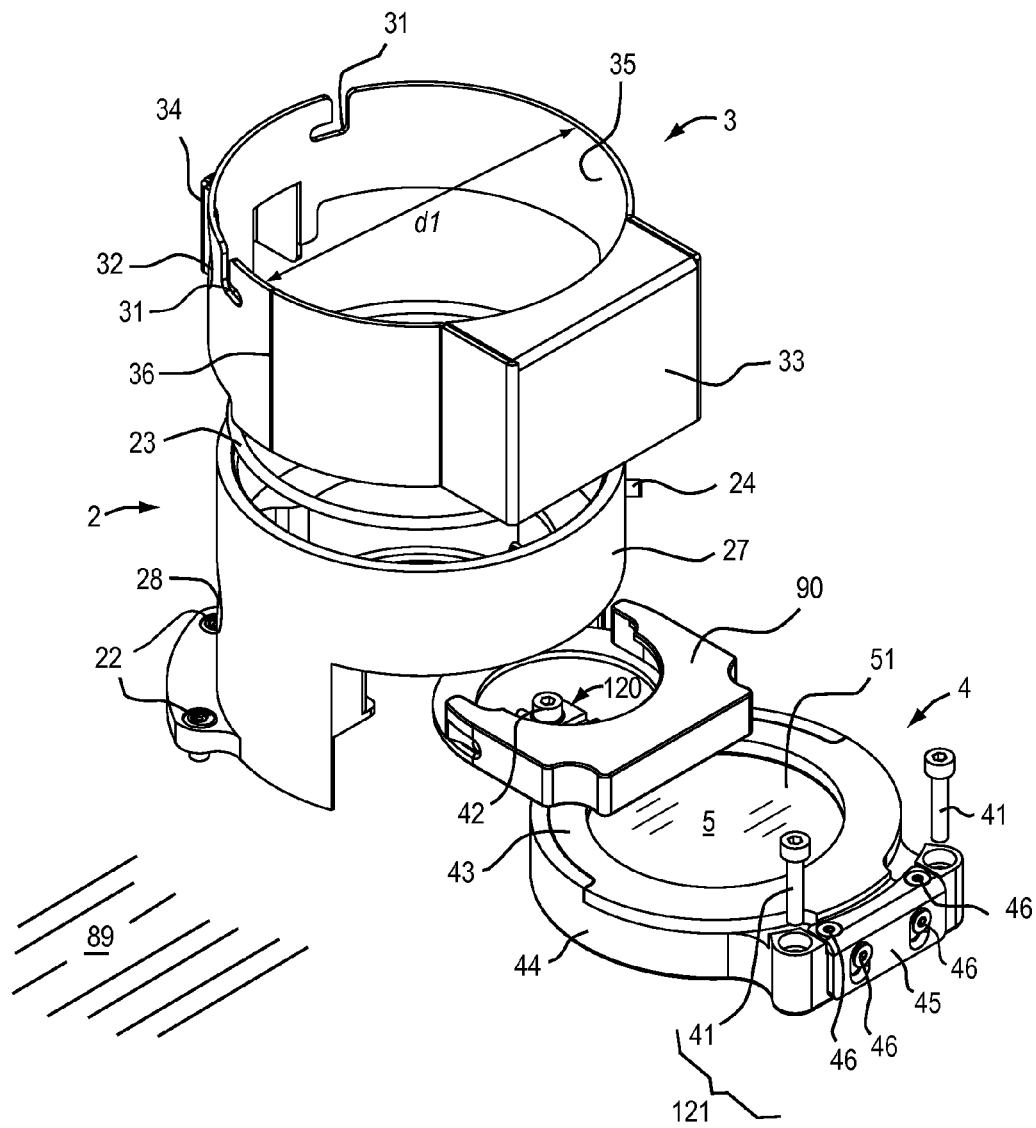
FIG. 2A is an exploded view of the laser shield, the laser beam housing, the filter holder, the fastening flange and the transmission window of the processing system, which is shown in FIG. 1.
Figure 2B:
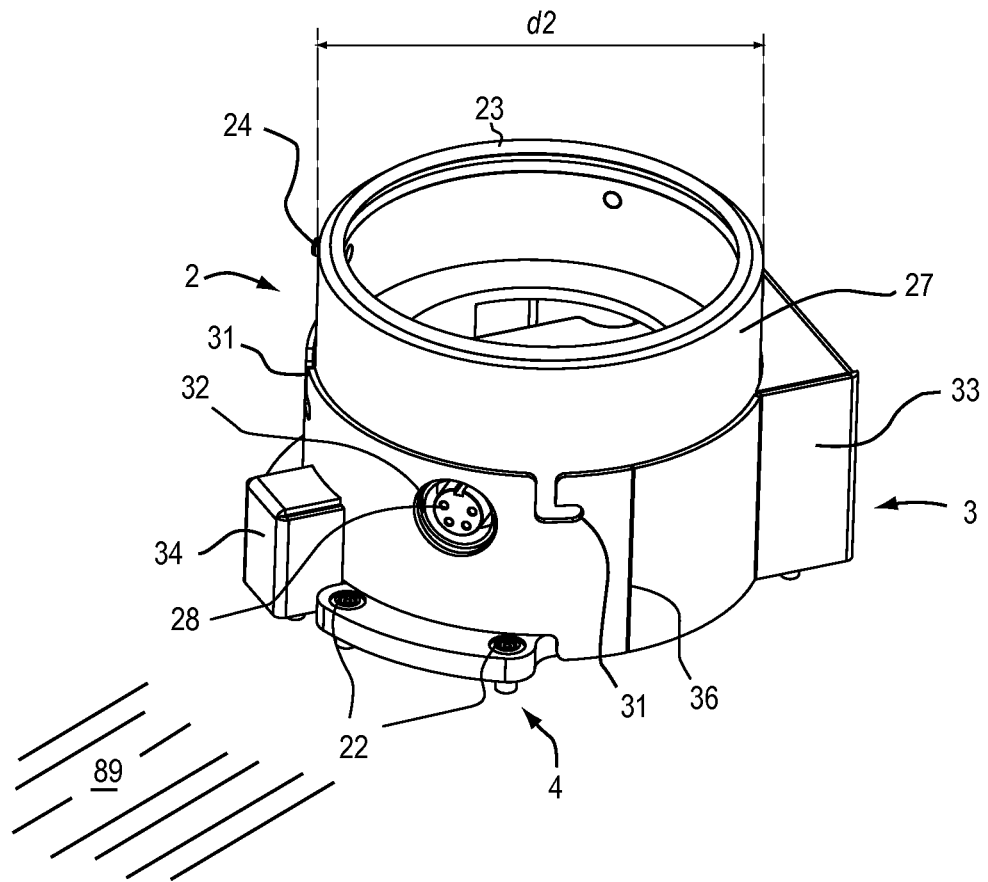
FIG. 2B is a perspective view of the components, which are illustrated in FIG. 2a in an assembled state, wherein the laser shield is arranged in a first arrangement for providing glare protection.
Figure 2C:
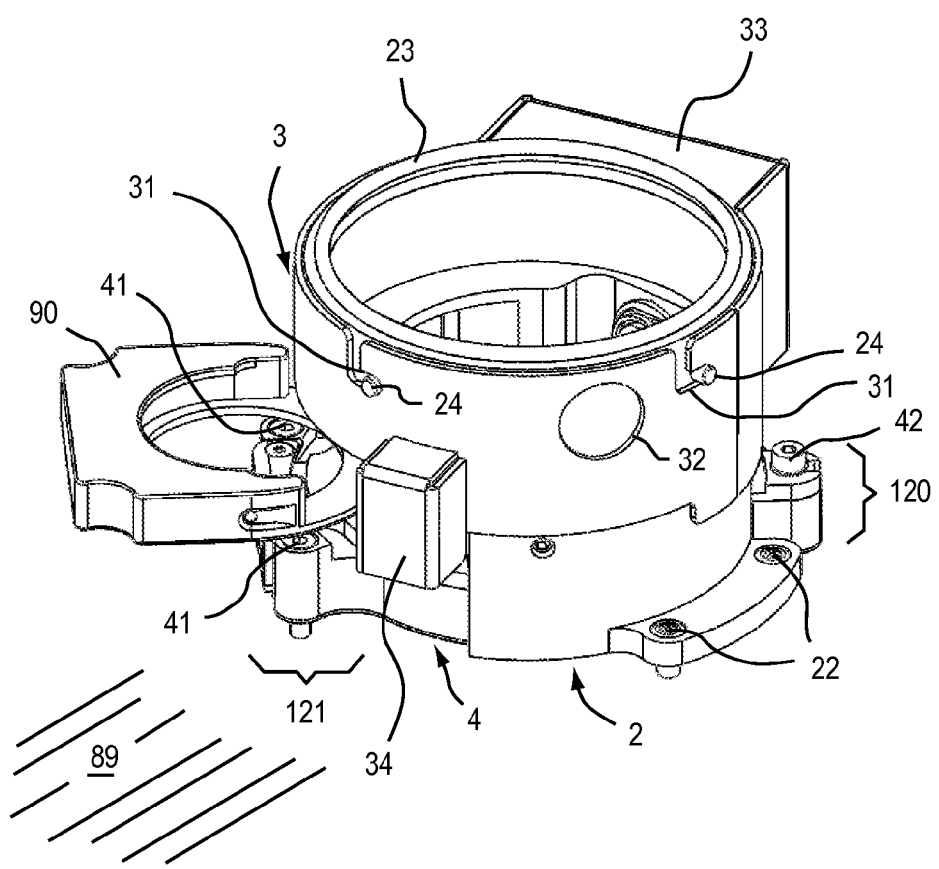
FIG. 2C is a perspective view of the components, which are illustrated in FIG. 2A in an assembled state, wherein the laser shield is arranged in a second arrangement for enabling separation of the fastening flange, the transmission window and/or the filter holder from the processing system.

FIGS. 2A, 2B and 2C show in detail the design of the laser beam housing 2, the laser shield 3, the fastening flange 4, the transmission window 5 and the filter holder 90. For simplicity of illustration, the optical filter is not shown.

FIG. 2A is an exploded view showing the components in an assembled state, wherein the laser shield 3 is arranged in the first arrangement for providing glare protection. In this arrangement, users of the processing system are protected from a glare caused the light of the laser beam. FIG. 2C also shows the same components also in the assemble state, wherein, however, the laser shield 3 is arranged in the second arrangement. In this arrangement, the fastening flange 4, the transmission window 5, the filter holder 90 and the optical filter are separable from the processing system.

The laser beam housing 2 comprises a cutout for at least partially receiving the filter holder 90 and a cutout for at least partially receiving the fastening flange 4. By way of example, the laser shield 3 may be formed using a metal forming process. The laser beam housing 2 and the laser shield 3 are configured such that the laser shield 3 is form-fittingly guided by the laser beam housing 2 for movement between the first arrangement and the second arrangement. By moving the laser shield 3 from the first arrangement to the second arrangement, the laser shield is moved to a greater distance from the fastening flange 4. Furthermore, the movement from the first arrangement to the second arrangement causes a change of the orientation of the laser shield 3 relative to the laser beam housing 2. As a result of the changed orientation, the fastening elements 41, 42 of the fastening flange 4, through which the fastening flange 4 is fastened to the chamber wall, 89 are rendered accessible.

By way of example, the laser shield 3 may be manufactured from a piece of sheet metal and may be provided with a welding seam such that the laser shield 3 continuously surrounds or encompasses the laser beam housing 2. However, it is also conceivable that the laser shield 3 is in the form of at least one sector, which partially surrounds or encompasses the laser beam housing 2.

The form-fitting guide is formed by an inner surface 35 of the laser shield 3 and by and outer surface 26 of the laser beam housing 2. The inner surface 35 and the outer surface 27 form corresponding guiding surfaces.

The inner surface 35 of the laser shield 3 faces the laser beam. The outer surface 27 of the laser beam housing 2 faces away from the laser beam. An inner diameter d1 (shown in FIG. 2A) of a circular cross-section of the inner surface 35 is greater than an outer diameter d2 (shown in FIG. 2B) of a circular cross-section of the outer surface 27 by a value of between 0.1 millimeters and 2 millimeters.

The laser beam housing 2 is abuttingly attached to the chamber wall 89 by fastening elements 22. The fastening flange 4 comprises a first fastening portion 120 and a second fastening portion 121. The first fastening portion 120 comprises a through-slit, into which a screw 42, serving as a fastening element, is arranged. The second fastening portion 121 comprises two through-holes. In each of these through-holes, a screw 41, serving as a fastening element, is disposed.

As it is shown in FIG. 2C, the laser beam housing 2 leaves the first and the second fastening portions 120, 121 accessible. The first and the second fastening portions 120, 121 are arranged outside of the laser beam housing 2. Thereby, the fastening elements 41, 42 are accessible, such that the fastening elements 41, 42 can be released without moving the laser beam housing 2.

The laser shield 3 comprises a first portion 34 and a second portion 33. The first portion 34 comprises a recess for at least partially accommodating the first fastening portion 120. The second portion 33 comprises a recess for at least partially accommodating the second fastening portion 101. As it is shown in FIG. 2B, the laser shield 3 and the laser beam housing 2 are configured such that in the first arrangement of the laser shield 3, the fastening portions 120, 121 are accommodated in the recesses of the first and the second portions 33, 34. Thereby, an effective glare protection is achieved. As it is illustrated in FIG. 2C, the laser shield 3 and the laser beam housing 2 are configured such that in the first arrangement of the laser shield 3, the laser shield 3 leaves the first and the second fastening portions 120, 121 accessible. The first and the second fastening portions 120, 121 are located outside of the laser shield 3 in the second arrangement. In the second arrangement, the laser shield 3 also leaves free a working space of the fastening elements 41, 42 of the fastening flange, such that the fastening elements 41, 42 can be released.

As it is further shown in FIG. 2C, the laser shield 3 is configured such that in the second arrangement of the laser shield 3, the filter holder 90 is separable from the processing system. Also during this process, the laser beam housing remains stationary and abuttingly attached to the chamber wall.

The laser shield 3 comprises further slit guides 31 which function as locking elements. In the second arrangement of the laser shield, locking bolts 24 of the laser beam housing 2 are in engagement with the slit guides 31. Thereby, the laser shield 3 can be locked in the second arrangement, which alleviates the separation of the fastening flange 4 and the filter holder 90 from the processing system.

At a connecting portion of the laser beam housing, which is located adjacent to the laser housing, a light-tight sealing element 23 is arranged to prevent light from escaping between the laser beam housing 2 and the laser housing (shown in FIG. 1 with reference numeral 9).

A female connector 28 is arranged in the laser beam housing 2. In the first arrangement of the laser shield 3, a connector (not shown in FIG. 2C) is connectable to the female connector 28 through an opening 32 or a through-recess formed in the laser shield 3 such that a portion of the connector is inserted through the opening 32. The connector is in signal communication with the controller 14 (shown in FIG. 1). The opening 32 is configured such that during the connection of the connector to the female connector 28, the laser shield 3 can not be removed from the first arrangement. In other words, it is not possible to change the position and orientation of the laser shield 3. The connector, the female connector 28 and the laser beam housing 2 therefore form a motion lock for the laser shield 3. For moving the laser shield 3 from the first arrangement to the second arrangement, it is necessary to release the connection of the connector to the female connector 28. The controller 14 and the female connector 28 are configured such that the controller can detect whether or not the connector is connected to the female connector 28. The female connector 28 comprises a contact bridge, which connects two contacts of the female connector 28. The controller is configured to measure an electrical conductivity between contacts of the connector, which correspond to the bridged contacts of the female connector 28.

Figure 3A:
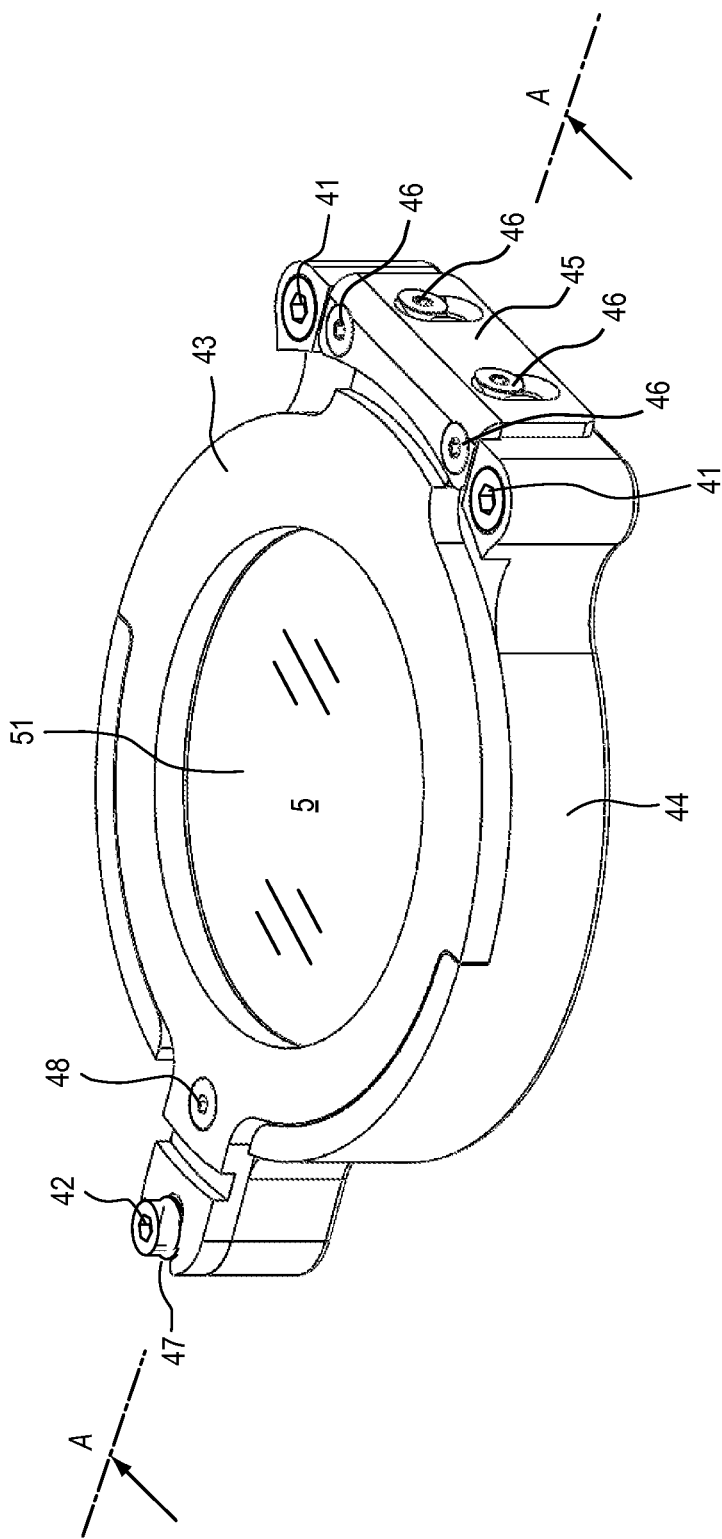
FIG. 3A is a perspective view of a side of the fastening flange and the transmission window, which faces away from the processing chamber.
Figure 3B:
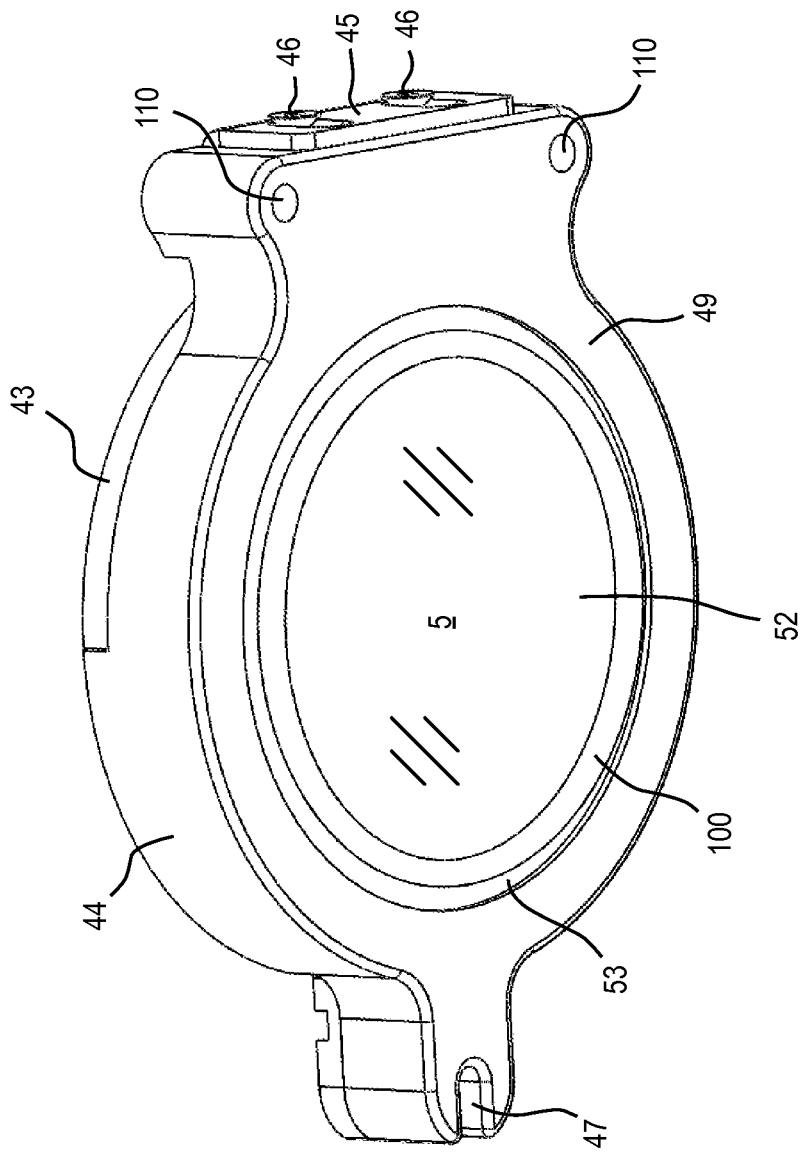
FIG. 3B is a perspective view of a side of the fastening flange, the transmission window and the sealing element, which faces the preparation chamber.
Figure 3C:
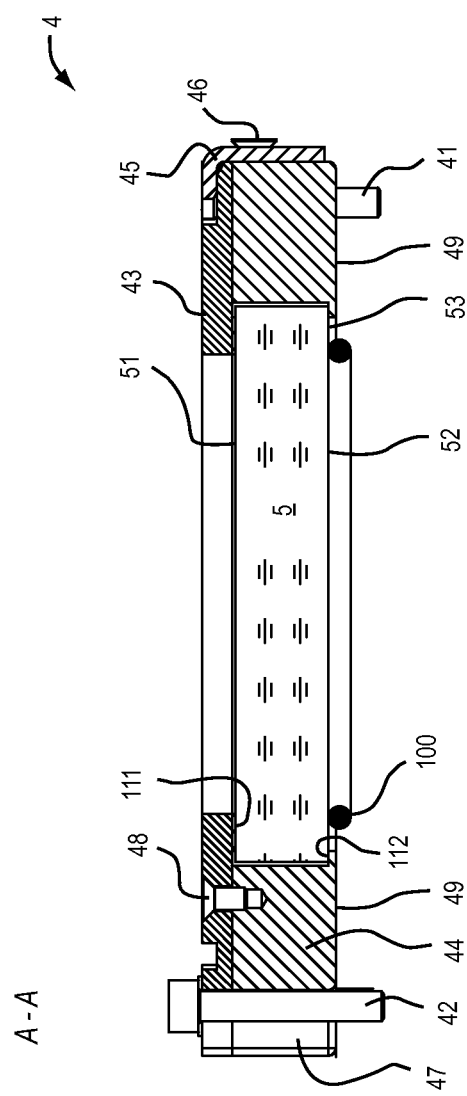
FIG. 3C is a sectional drawing of the fastening flange, the transmission window and the sealing element taken along the cutting line, which is shown in FIG. 3A.

FIGS. 3A, 3B and 3C show different views of the fastening flange 4 and the transmission window 5. FIG. 3A is a perspective view showing a side, which faces away from the chamber wall (denoted with reference numeral 89 in FIGS. 1, 2A, 2B and 2C). FIG. 3B is a perspective view showing a side, which faces the chamber wall and FIG. 3C is a cross-sectional view through the fastening flange and the window, taken along line A-A, which is shown in FIG. 3A.

The fastening flange 4 comprises through-holes 110 (shown in FIG. 3B) and a through-slit 47. The through-slit 47 opens into a narrow side of the fastening flange 4. In the through-holes 110 and in the through-slit 47, crews can be arranged, which function as fastening elements 42, 41, by which the fastening flange 4 can be fastened to the chamber wall. The fastening elements 42, 41 thereby represent a first fastening system for fastening the fastening flange 4 to the chamber wall.

The fastening flange 4 comprises a first flange element 44 which comprises a recess for accommodating the transmission window 5. Furthermore, the fastening flange 4 comprises fastening elements 46, 48. The fastening elements 46, 48 are configured as screws. Furthermore, the fastening flange 4 comprises a second flange element 43 and a locking plate 45.

The second flange element 43 is fastened to the first flange element 44 by the fastening element 48 and by fastening of the locking plate 45 to the first and the second flange elements 43, 44 with the fastening elements 46. Thereby, the transmission window is fastened to the fastening flange 4 by clamping.

The fastening flange 4 may comprise a first ring element (not illustrated), which is arranged between the first flange element 44 and the transmission window 5 and/or a second ring element (not illustrated), which is arranged between the second flange element 43 and the transmission window 5.

The fastening flange 4 comprises a cassette housing, which at least partially accommodates or receives the transmission window 5. A transmission region of the transmission window 5, through which the laser beam traverses the transmission window 5, is left exposed by the cassette housing. The fastening elements 48, 46 for fastening the transmission window 5 to the fastening flange 4 represent a second fastening system.

The first fastening system (i.e. the fastening elements 41 and 42) can be released without having to release the second fastening system (i.e. the fastening elements 46 and 48). Thereby, it is possible to separate the fastening flange 4 from the processing system, with the transmission window 5 remaining fastened to the fastening flange 5. This allows to separate the transmission window 5 from the processing system within a short time. Even more, during cleaning and maintenance processes, the transmission window 5 can remain fastened to the fastening flange 4.

The transmission window 5, comprises a first wide side surface 51, which is arranged toward the exterior of the preparation chamber. A sealing element 100 (shown in FIGS. 3B and 3C) in the form of a ring is arranged at a second wide side surface 52 of the transmission window 5. The sealing element 100 is pressed against a sealing surface of the chamber wall when the first fastening system (i.e. the fastening elements 41 and 42) is fastened. Hence, the second wide side surface 52 has a sealing surface. The second wide side surface 52 comprises a first region, which is disposed toward the interior of the preparation chamber, and a second region 53, which is disposed toward the exterior of the preparation chamber. Between the first and the second region, the sealing surface of the second wide side surface 52 is located.

The first flange element 44 comprises a first clamping surface 112 (shown in FIG. 3C) and the second flange element 43 comprises a second clamping surface 111. The first and the second clamping surfaces 112, 111 fasten the transmission window 5 at an abutting surface of the first wide side surface 51 and an abutting surface of the second wide side surface 52. Thereby, the transmission window 5 is fastened to the fastening flange 4 by clamping the transmission window at the abutting surfaces of the first and the second wide side surfaces 51, 52. Thereby, the transmission window 5 can be separated from the processing system in an easy way, and the transmission window can remain fastened to the fastening flange during cleaning and maintenance processes. Thereby also, the transmission window 5 is replaceably fastened by the fastening flange 4.

The fastening flange 4 comprises an abutting surface 49 (shown in FIGS. 3B and 3C). When the fastening flange 4 is fastened to the chamber wall, the fastening flange 4 abuts the chamber wall at the abutting surface 49. Thereby, it is ensured that the transmission window 5 has an unchanged position and orientation relative to the chamber wall. Thereby, the position of the laser beam is not varied in the scanning field after the transmission window has been separated from a processing system for performing cleaning and/or maintenance processes. This allows to achieve unchanged scanning positions of the laser beam in the object region.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A processing system for micro processing by laser processing of an object, the processing system comprising:
   a preparation chamber;
   a laser configured to generate a laser beam for performing the laser processing within the preparation chamber;
   a transmission window, configured such that the laser beam enters into the preparation chamber through the transmission window;
   a fastening flange for fixing the transmission window relative to the preparation chamber;
   a laser beam housing, configured such that a portion of the laser beam, which is located outside of the preparation chamber, extends within the laser beam housing;
   a laser shield configured to provide, in a first arrangement of the laser shield, glare protection from a passage of the laser beam from the laser beam housing to the preparation chamber;
   wherein the laser shield is movably mounted for movement between the first arrangement and a second arrangement of the laser shield, wherein in the second arrangement, at least one of the transmission window and the fastening flange is separable from the processing system.

2. The processing system of claim 1, further comprising:
   an electrical connector, arranged stationary relative to at least one of the laser beam housing and the preparation chamber; and
   an electrical mating connector;
   wherein the laser shield is configured such that a connection of the mating connector to the connector requires the first arrangement of the laser shield.

3. The processing system according to claim 1, further comprising a light optical component, which is attached to the laser beam housing, wherein at least a portion of the light optical component is arranged in the laser beam.

4. The processing system according to claim 1, wherein the laser shield is movably mounted such that the laser shield is movable from the first arrangement to an arrangement, in which the light optical component is separable from the processing system.

5. The processing system according to claim 1,
   wherein the fastening flange comprises a first fastening system for fastening the fastening flange to the preparation chamber;
   wherein the laser beam housing is abuttingly attached to the preparation chamber and comprises a cutout for at least partially receiving the fastening flange, wherein the laser beam housing leaves a working space of the first fastening system; and
   wherein the laser shield comprises a cutout for at least partially receiving the first fastening system in the first arrangement of the laser shield.

6. The processing system according to claim 1, further comprising a sealing element, which is arranged between a sealing surface of the transmission window and a sealing surface of the preparation chamber.

7. The processing system according to claim 6, further comprising a sealing element, which is arranged between a sealing surface of the transmission window and a sealing surface of the preparation chamber;
wherein the sealing surface of the transmission window is arranged at a wide side surface of the transmission window.

8. The processing system according to claim 1, wherein the transmission window comprises a first abutting surface on a first wide side surface of the transmission window and a second abutting surface on a second wide side surface of the transmission window;
wherein the transmission window is fastened to the fastening flange at the first and second abutting surfaces.

9. The processing system according to claim 1, further comprising an optical measuring system, which is at least partially received within the laser beam housing, wherein the optical measuring system is configured to measure parameters of the laser beam.

10. The processing system according to claim 1, wherein the processing system further comprises a detector system, which is at least partially received within the laser beam housing;
wherein at least one of the following holds:
the detector system is configured to detect light emitted from an interior of the preparation chamber; and
the detector system is configured for an optical endpoint detection of the laser processing.

11. The processing system according to claim 1, wherein the fastening flange comprises an abutting surface, which abuts against the preparation chamber.

12. The processing system according to claim 1, wherein the fastening flange is arranged outside of the preparation chamber.

13. The processing system according to claim 1,
wherein the fastening flange comprises a first fastening system for fastening the fastening flange to the preparation chamber;
wherein the fastening flange further comprises a second fastening system for fastening the transmission window to the fastening flange; and
wherein the fastening flange is configured such that the first fastening system is releasable with the second fastening system remaining fastened.

14. The processing system according to claim 1,
wherein the laser shield comprises a guiding surface, which faces the laser beam, and the laser beam housing comprises a guiding surface, which faces away from the laser beam;
wherein the guiding surface of the laser shield and the guiding surface of the laser beam housing are configured as a form-fitting guide for movably guiding the laser shield.

15. A processing system for micro processing by laser processing of an object, the processing system comprising:
a preparation chamber;
a laser configured to generate a laser beam for performing the laser processing within the preparation chamber;
a transmission window, configured such that the laser beam enters into the preparation chamber through the transmission window;
a fastening flange for fixing the transmission window relative to the preparation chamber;
a laser beam housing, configured such that a portion of the laser beam, which is located outside of the preparation chamber, extends within the laser beam housing;
a laser shield configured to provide, in a first arrangement of the laser shield, glare protection from a passage of the laser beam from the laser beam housing to the preparation chamber;
wherein the laser shield is movably mounted for movement between the first arrangement and a second arrangement of the laser shield,
an electrical connector, arranged stationary relative to at least one of the laser beam housing and the preparation chamber; and
an electrical mating connector;
wherein the laser shield is configured such that a connection of the mating connector to the connector requires the first arrangement of the laser shield.

16. The processing system according to claim 15, wherein the laser shield comprises a through-recess;
wherein in the first arrangement of the laser shield, the mating connector is connectable to the connector by inserting the mating connector through the through-recess; and
wherein the laser shield is configured such that a deviation from the first arrangement of the laser shield blocks the mating connector from being connected to the connector.

17. The processing system according to claim 15,
wherein the fastening flange comprises a first fastening system for fastening the fastening flange to the preparation chamber;
wherein the laser beam housing is abuttingly attached to the preparation chamber and comprises a cutout for at least partially receiving the fastening flange, wherein the laser beam housing leaves a working space of the first fastening system; and
wherein the laser shield comprises a cutout for at least partially receiving the first fastening system in the first arrangement of the laser shield.

18. The processing system according to claim 15, wherein the transmission window comprises a first abutting surface on a first wide side surface of the transmission window and a second abutting surface on a second wide side surface of the transmission window;
wherein the transmission window is fastened to the fastening flange at the first and second abutting surfaces.

19. The processing system according to claim 15,
wherein the laser shield comprises a guiding surface, which faces the laser beam, and the laser beam housing comprises a guiding surface, which faces away from the laser beam;
wherein the guiding surface of the laser shield and the guiding surface of the laser beam housing are configured as a form-fitting guide for movably guiding the laser shield.

20. A processing system for micro processing by laser processing of an object, the processing system comprising:
a preparation chamber;
a laser configured to generate a laser beam for performing the laser processing within the preparation chamber;
a transmission window, configured such that the laser beam enters into the preparation chamber through the transmission window;
a fastening flange for fixing the transmission window relative to the preparation chamber;
wherein the fastening flange comprises a first fastening system for fastening the fastening flange to the preparation chamber;

a laser beam housing, configured such that a portion of the laser beam, which is located outside of the preparation chamber, extends within the laser beam housing;

wherein the laser beam housing comprises a cutout for at least partially receiving a portion of the fastening flange, wherein the laser beam housing leaves a working space of the first fastening system;

a laser shield configured to provide, in a first arrangement of the laser shield, glare protection from a passage of the laser beam from the laser beam housing to the preparation chamber;

wherein the laser shield comprises a cutout for at least partially receiving the first fastening system in the first arrangement of the laser shield.

21. The processing system according to claim 20, further comprising a sealing element, which is arranged between a sealing surface of the transmission window and a sealing surface of the preparation chamber.

22. The processing system according to claim 20, wherein the transmission window comprises a first abutting surface on a first wide side surface of the transmission window and a second abutting surface on a second wide side surface of the transmission window;

wherein the transmission window is fastened to the fastening flange at the first and second abutting surfaces.

23. The processing system according to claim 20, wherein the laser shield comprises a guiding surface, which faces the laser beam, and the laser beam housing comprises a guiding surface, which faces away from the laser beam;

wherein the guiding surface of the laser shield and the guiding surface of the laser beam housing are configured as a form-fitting guide for movably guiding the laser shield.

24. A processing system for micro processing by laser processing of an object, the processing system comprising:

a preparation chamber;

a laser configured to generate a laser beam for performing the laser processing within the preparation chamber;

a transmission window, configured such that the laser beam enters into the preparation chamber through the transmission window;

wherein a first wide side surface of the transmission window is disposed toward an exterior of the preparation chamber and at least a portion of a second wide side surface of the transmission window is disposed toward an interior of the preparation chamber;

a sealing element, which is arranged between a sealing surface of the transmission window and a sealing surface of the preparation chamber;

a fastening flange for fixing the transmission window relative to the preparation chamber;

wherein the transmission window comprises a first abutting surface located on the first wide side surface and a second abutting surface located on the second wide side surface; and wherein the transmission window is fastened to the fastening flange at the first and the second fastening surfaces.

25. The processing system according to claim 24;

wherein the laser shield comprises a guiding surface, which faces the laser beam, and the laser beam housing comprises a guiding surface, which faces away from the laser beam;

wherein the guiding surface of the laser shield and the guiding surface of the laser beam housing are configured as a form-fitting guide for movably guiding the laser shield.

26. The processing system according to claim 24, further comprising a sealing element, which is arranged between a sealing surface of the transmission window and a sealing surface of the preparation chamber;

wherein the sealing surface of the transmission window is arranged at a wide side surface of the transmission window.

27. The processing system according to claim 24, wherein the fastening flange comprises clamping surfaces for a clamping of the transmission window at the first and the second abutting surfaces.

* * * * *